US012696661B2

(12) United States Patent
Kim

(10) Patent No.: US 12,696,661 B2
(45) Date of Patent: Jul. 28, 2026

(54) DISPLAY APPARATUS

(71) Applicant: LG Display Co., Ltd., Seoul (KR)

(72) Inventor: SangWon Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 371 days.

(21) Appl. No.: 18/498,955

(22) Filed: Oct. 31, 2023

(65) Prior Publication Data

US 2024/0215390 A1     Jun. 27, 2024

(30) Foreign Application Priority Data

Dec. 27, 2022     (KR) ........................ 10-2022-0185450

(51) Int. Cl.
H10K 59/80 (2023.01)
(52) U.S. Cl.
CPC ..... H10K 59/8722 (2023.02); H10K 59/8792 (2023.02)

(58) Field of Classification Search
CPC .......... G02F 1/133308; H10K 50/8326; H10K 50/844; H10K 59/129; H10K 59/8722; H10K 59/8791; H10K 59/873; H10K 59/8792
See application file for complete search history.

(56) References Cited

U.S. PATENT DOCUMENTS

2016/0291404 A1* 10/2016 Kim .................. G02F 1/133528
2016/0313487 A1* 10/2016 Wang .................... G02B 6/0068
2022/0413561 A1* 12/2022 Ishikawa .............. G06F 1/1637
2024/0310573 A1* 9/2024 Wang .................... G02F 1/1336

* cited by examiner

*Primary Examiner* — Fazli Erdem
(74) *Attorney, Agent, or Firm* — Seed Intellectual Property Law Group LLP

(57) ABSTRACT
A display apparatus is disclosed. The display apparatus includes a first plate, a second plate, a display panel, and a cover member. The second plate, the display panel, and the cover member are sequentially stacked on the first plate. The display apparatus includes a double-sided adhesive member configured to bond the second plate and the cover member to the first plate at edges.

21 Claims, 6 Drawing Sheets

DISPLAY APPARATUS

CROSS-REFERENCE TO RELATED APPLICATION(S)

This application claims the benefit of Korean Patent Application No. 10-2022-0185450, filed on Dec. 27, 2022, which is hereby incorporated by reference as if fully set forth herein.

BACKGROUND

Technical Field

The present disclosure relates to a display apparatus.

Description of the Related Art

In recent years, with the advent of the information age, the field of displays configured to visually express electrical information signals have rapidly developed. As such, a variety of display apparatuses having excellent performance such as slimness, lightness and low power consumption have been developed and used.

Examples of such display apparatuses may include a liquid crystal display (LCD) apparatus, an organic light emitting display (OLED) apparatus, an inorganic light emitting display apparatus, etc. The organic light emitting display apparatus is a next-generation display apparatus having self-luminous characteristics, and has excellent characteristics in terms of viewing angle, contrast, response time, power consumption, etc.

BRIEF SUMMARY

Accordingly, the present disclosure is directed to a display apparatus that substantially obviates one or more problems due to limitations and disadvantages of the related art.

Various embodiments of the present disclosure provide a display apparatus capable of reducing or minimizing generation of a gap between a first plate and a display module using a double-sided adhesive member, thereby preventing penetration of foreign matter or moisture.

Technical benefits of the present disclosure are not limited to the above-described benefits, and other benefits of the present disclosure not yet described will be more clearly understood by those skilled in the art from the following detailed description.

To achieve these objects and other advantages and in accordance with the purpose of the disclosure, as embodied and broadly described herein, a display apparatus includes a first plate, a second plate, a display panel, and a cover member sequentially stacked on the first plate, and a double-sided adhesive member configured to bond the second plate and the cover member to the first plate at edge portions of four sides of the display apparatus.

The contents of the present disclosure described in conjunction with problems to be solved, solutions to the problems, and effects do not specify essential features of the claims and, as such, the scope of the claims is not limited to the matters described in the contents of the present disclosure.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and along with the description serve to explain the principle of the disclosure. In the drawings.

DETAILED DESCRIPTION

Figure 1:
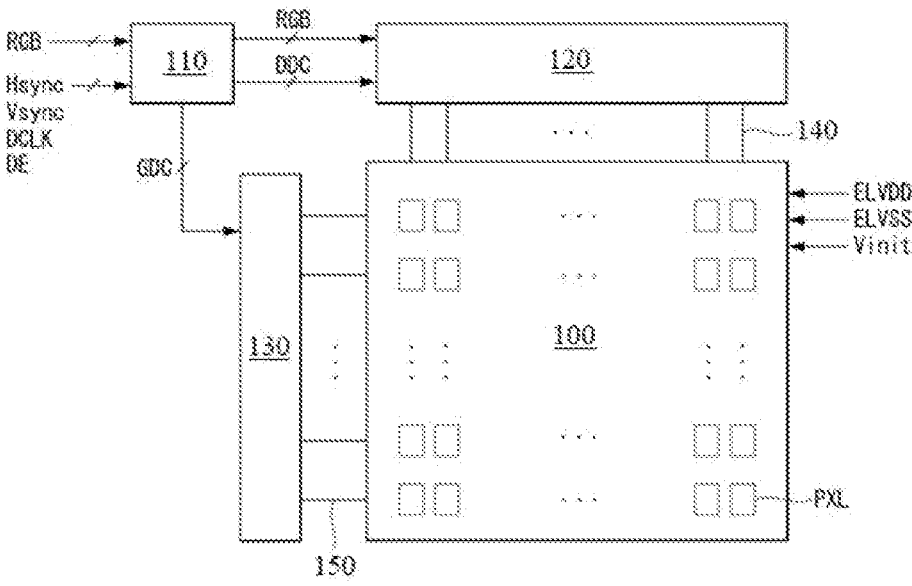
FIG. 1 is a block diagram briefly showing a configuration of a display apparatus according to an embodiment of the present disclosure.

Advantages and features of the present disclosure and methods for achieving the same will be made clear from embodiments described below in detail with reference to the accompanying drawings. The present disclosure may, however, be embodied in many different forms, and should not be construed as being limited to the embodiments set forth herein. Here, embodiments of the present disclosure are provided so that the present disclosure may be sufficiently thorough and complete to assist those skilled in the art in fully understanding the scope of the present disclosure.

The shapes, sizes, dimensions (e.g., length, width, height, thickness, radius, diameter, area, etc.), ratios, angles, number of elements, and the like illustrated in the accompanying drawings for describing the embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Throughout the present specification, the same reference numerals designate the same constituent elements. In addition, in the following description of the present disclosure, a detailed description of known functions and configurations incorporated herein will be omitted when it may make the subject matter of the present disclosure rather unclear.

The terms "comprises" "includes" and/or "has," used in this specification, do not preclude the presence or addition of other elements unless used along with the term "only." The singular forms are intended to include the plural forms as well, unless the context clearly indicates otherwise.

In the interpretation of constituent elements included in the various embodiments of the present disclosure, the constituent elements are interpreted as including an error range even if there is no explicit description thereof.

In the description of the various embodiments of the present disclosure, when describing positional relationships, for example, when the positional relationship between two parts is described using "on," "above," "below," "next to," or the like, one or more other parts may be located between the two parts unless the term "directly" or "closely" is used.

It may be understood that, although ordinal numbers "first," "second," etc., may be used herein to distinguish constituent elements from one another, functions or structures of these elements are not to be limited by ordinal numbers or names of the elements. Since the claims are described mainly in conjunction with essential constituent elements, the ordinal number prefixed to the name of each constituent element in the claims may not be identical to the ordinal number used in the description of the embodiments.

The respective features of the various embodiments of the present disclosure may be partially or entirely coupled to and combined with each other, and various technical linkages and modes of operation thereof are possible. These various embodiments may be performed independently of each other, or may be performed in association with each other.

Hereinafter, a display apparatus according to an embodiment of the present disclosure will be described in detail with reference to the accompanying drawings.

FIG. 1 is a block diagram briefly showing a configuration of a display apparatus according to an embodiment of the present disclosure.

Referring to FIG. 1, the display apparatus according to the embodiment of the present disclosure includes a display panel 100 formed with pixels PXL, a data driving circuit 120 configured to drive data lines 140, a gate driving circuit 130 configured to drive gate lines 150, and a timing controller 110 configured to control driving timings of the data driving circuit 120 and the gate driving circuit 130.

In the display panel 100, a plurality of data lines 140 and a plurality of gate lines 150 intersect each other, and pixels PXL are disposed in respective intersection areas in a matrix form. The pixels PXL disposed on the same horizontal line constitute one pixel row. The pixels PXL disposed on one pixel row are connected to one gate line 150, and one gate line 150 may include at least one scan line and at least one emission line. For example, each pixel PXL may be connected to one data line 140, at least one scan line, and at least one emission line. The pixels PXL may receive, in common, high-level and low-level drive voltages ELVDD and ELVSS and an initialization voltage Vinit from a power generator. In order to prevent unnecessary light emission of a light emitting device, for example, an organic light emitting diode (OLED), in an initialization period and a sampling period, the initialization voltage Vinit Is preferably selected within a voltage range sufficiently lower than an operating voltage of the OLED, and may be set to be equal to or lower than the low-level drive voltage ELVSS.

Thin film transistors (TFTs) constituting each pixel PXL may each be implemented by an oxide TFT including an oxide semiconductor layer. The oxide TFT is advantageous in that the display panel 100 may have a large area, wholly taking into consideration electron mobility, process deviation, etc. However, the present disclosure is not limited to the above-described condition, and the semiconductor layer of each TFT may be formed of amorphous silicon, polysilicon, or the like.

Each pixel PXL may include a driving TFT configured to supply current to the light emitting device, a switching TFT configured to supply a data voltage to the driving TFT, and a storage capacitor configured to maintain the data voltage supplied to the driving TFT for one frame. Each pixel PXL may further include a plurality of TFTs and a storage capacitor in order to compensate for a variation in threshold voltage of the driving TFT.

The timing controller 110 rearranges digital video data RGB input thereto from an outside thereof, corresponding to a resolution of the display panel 100, and then supplies the rearranged digital video data RGB to the data driving circuit 120. In addition, the timing controller 110 generates a data control signal DDC for control of the operation timing of the data driving circuit 120 and a gate control signal GDC for control of the operation timing of the gate driving circuit 130, based on timing signals such as a vertical synchronization signal Vsync, a horizontal synchronization signal Hsync, a dot clock signal DCLK, a data enable signal DE, etc.

The data driving circuit 120 converts the digital video data RGB input thereto from the timing controller 110 into an analog data voltage, based on the data control signal DDC, and provides the analog data voltage to each data line 140.

The data driving circuit 120 may include at least one source drive integrated circuit IC (SIC). The source drive IC (SIC) converts digital video data of an input image into an analog gamma compensation voltage under control of the timing controller (T-CON) 110, thereby generating a data voltage, and outputs the data voltage to the data lines 140. The source drive IC (SIC) may be mounted on a flexible circuit board, which may be bent, for example, a chip-on-film (COF), or may be directly bonded to a substrate in a non-active area of the display panel 100. In the following description, the flexible circuit board will be referred to as a "flexible circuit board COF."

Flexible circuit boards COF as described above are bonded to a pad area of the display panel 100 and a source PCB by an anisotropic conductive film (ACF). Input pins of the flexible circuit boards COF are electrically connected to output terminals (pads) of the source PCB. Output pins of the flexible circuit boards COF are electrically connected to data pads formed at the substrate of the display panel 100.

The gate driving circuit 130 may generate a scan signal and an emission signal based on the gate control signal GDC. The gate driving circuit 130 may include a scan driver and an emission driver. The scan driver may generate a scan signal and may supply the scan signal to the gate lines 150 in a row sequential manner, in order to drive at least one scan line connected to each pixel row. The emission driver may generate an emission signal and may supply the emission signal to the emission lines in a row sequential manner, in order to drive at least one emission line connected to each pixel row.

The gate driving circuit 130 as described above may be directly formed on the non-active area of the display panel 100 in a gate-driver-in-panel (GIP) manner.

Figure 2:
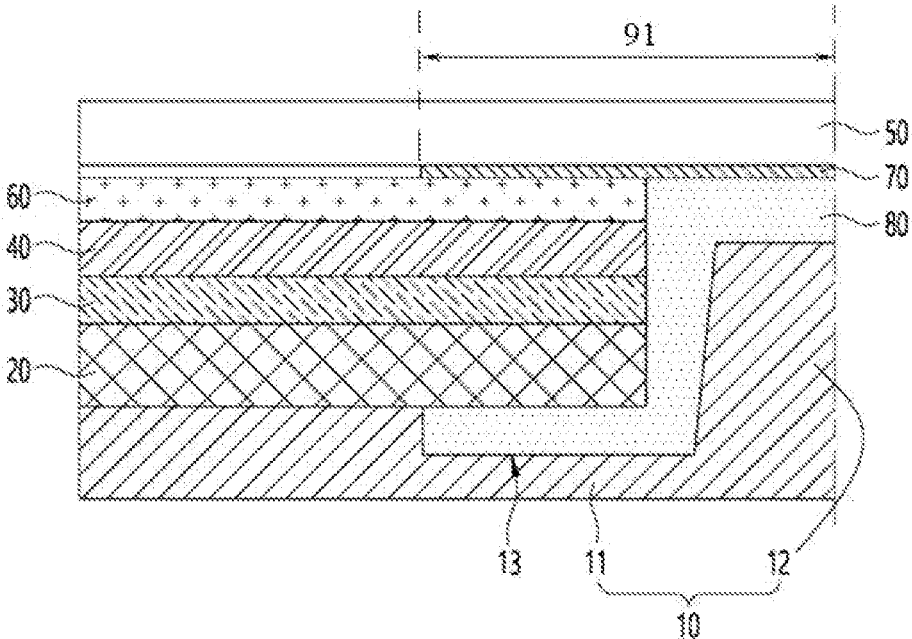
FIG. 2 is a cross-sectional view of one end of the display apparatus according to the embodiment of the present disclosure.

FIG. 2 is a cross-sectional view of one end of the display apparatus according to the embodiment of the present disclosure.

As shown in FIG. 2, the display apparatus according to the embodiment of the present disclosure may be configured through inclusion of a first plate 10, a second plate 20, a display panel 30, an optical film 40, and a cover member 50.

The second plate 20 may be disposed between the first plate 10 and the display panel 30. The optical film 40 may be disposed on the display panel 30. The optical film 40 and the cover member 50 may be bonded to each other by an optically clear adhesive (OCA) 60. The optical film 40 may be omitted.

The first plate 10 may be a core plate.

The second plate 20 may include aluminum or the like, for heat dissipation of the display apparatus.

The optical film 40 may include a polarization plate or the like.

The cover member 50 may include a cover glass, a cover window, or the like.

A black layer 70 may be included in a back surface of the cover member 50 in a bezel region.

The black layer 70 may include a black ink.

The first plate 10 includes a bottom surface 11, and a barrier wall 12 upwardly bent from an edge portion of the bottom surface 11. The second plate 20, the display panel 30, and the optical film 40 are disposed on the bottom surface 11 inside the barrier wall 12 of the first plate 10.

The second plate 20 and the cover member 50 are bonded to the first plate 10 at edge portions of four surfaces of the display apparatus by a double-sided adhesive member 80. For example, one adhesive surface of the double-sided adhesive member 80 is bonded to a bezel region 91 of the cover member 50 coated with the black layer 70, side surfaces of the display panel 30 and the optical film 40, and a back surface of the second plate 20, whereas the other adhesive surface of the double-sided adhesive member 80 is bonded to a surface (e.g., an upper surface) of the barrier wall 12 of the first plate 10, an inner surface of the barrier wall 12, and a portion of the bottom surface 11 of the first plate 10.

A groove 13 may be included in the bottom surface 11 of the first plate 10 to which the double-sided adhesive member 80 is bonded.

Accordingly, although the second plate 20 is bonded to the first plate 10 by the double-sided adhesive member 80, there is no gap formed between the second plate 20 and the first plate 10 because the groove 13 is formed on the bottom surface 11 of the first plate 10.

Figure 3:
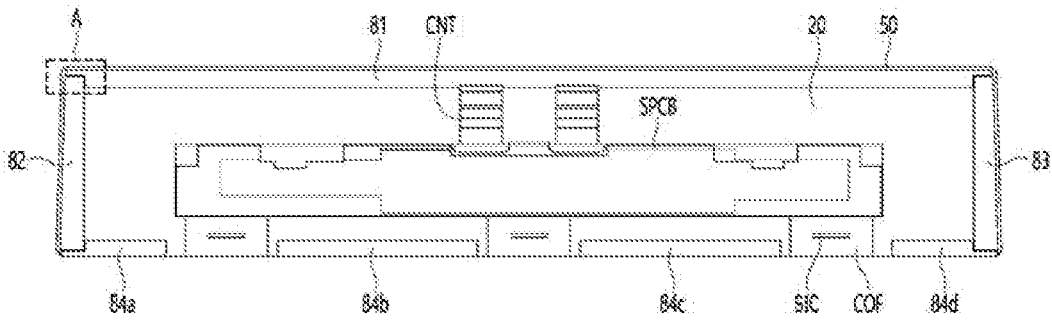
FIG. 3 is a bottom view of the display apparatus according to the embodiment of the present disclosure.

FIG. 3 is a bottom view of the display apparatus according to the embodiment of the present disclosure. For example, FIG. 3 shows the back surface of the second plate 20.

As described with reference to FIG. 1, the data driving circuit 120 may include at least one source drive IC SIC, and the source drive IC SIC may be mounted on a flexible circuit board COF, which may be bent, and may be bonded to the pad area of the display panel 100 and the source PCB SPCB. As the flexible circuit board COF is bent, the source PCB SPCB may be disposed at the back surface of the second plate 20. A connector CNT for connection to an external appliance or a set PCB may be installed at one side of the source PCB SPCB.

The second plate 20 and the cover member 50 are bonded to the first plate 10 by the double-sided adhesive member 80 at most edge portions of the four sides of the display apparatus where the flexible circuit board COF is not disposed.

The double-sided adhesive member 80 includes a first double-sided adhesive member 81 bonded to a first edge portion opposite to an edge portion where flexible circuit boards COF are disposed, second and third double-sided adhesive members 82 and 83 respectively bonded to two edge portions adjacent to the first edge portion, and fourth and fifth double-sided adhesive members 84*a*, 84*b*, 84*c*, and 84*d* respectively bonded to the edge portion where the flexible circuit boards COF are disposed. The fourth and fifth double-sided adhesive members 84*a*, 84*b*, 84*c*, and 84*d* are bonded between the flexible circuit boards COF. The fourth double-sided adhesive members 84*a* and 84*d* may be bonded adjacent to the second and third double-sided adhesive members 82 and 83, respectively. The fifth double-sided adhesive members 84*b* and 84*c* may be bonded between the fourth double-sided adhesive members 84*a* and 84*d*.

The first to fifth double-sided adhesive members 81, 82, 83, 84*a*, 84*b*, 84*c*, and 84*d* may be bonded while being spaced apart from one another without overlapping one another.

If the first to fifth double-sided adhesive members 81, 82, 83, 84*a*, 84*b*, 84*c*, and 84*d* overlap one another, the double-sided adhesive member 80 may come undone. To this end, the first to fifth double-sided adhesive members 81, 82, 83, 84*a*, 84*b*, 84*c*, and 84*d* should be spaced apart from one another, taking into consideration adhesion tolerances according to thickness management.

For example, the first double-sided adhesive member 81 and the second and third double-sided adhesive members 82 and 83 are bonded to the back surface of the second plate 20 under the condition that the first double-sided adhesive member 81 and the second and third double-sided adhesive members 82 and 83 do not overlap each other. In addition, corresponding ones of the fourth double-sided adhesive members 84*a* and 84*d* and the second and third double-sided adhesive members 82 and 83 are bonded to the back surface of the second plate 20 while being spaced apart from each other without overlapping each other.

In addition, a predetermined gap is provided between the first double-sided adhesive member 81 and the second and third double-sided adhesive members 82 and 83, and a predetermined gap is also provided between corresponding ones of the fourth double-sided adhesive members 84*a* and 84*d* and the second and third double-sided adhesive members 82 and 83, taking into consideration expansion of the double-sided adhesive members. The gaps may have various shapes.

Figure 4:
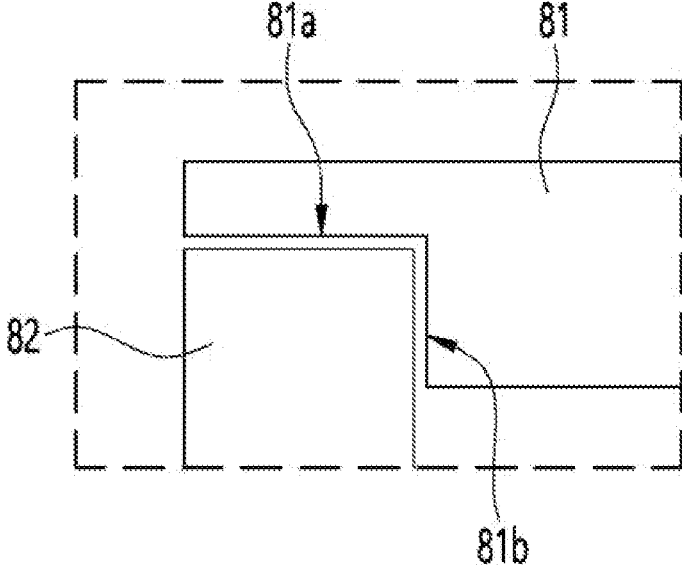
FIG. 4 is an enlarged view of a portion "A" in FIG. 3 according to an embodiment of the present disclosure.

FIG. 4 is an enlarged view of a portion "A" in FIG. 3 according to an embodiment of the present disclosure.

As shown in FIG. 4, the first double-sided adhesive member 81 and the fourth double-sided adhesive members 84*a* and 84*d* adjacent to the second and third double-sided adhesive members 82 and 83 are cut to have a "¬" shape. Accordingly, the first double-sided adhesive member 81 or each of the fourth double-sided adhesive members 84*a* and 84*d* has a first cut surface 81*a* extending inwards from an edge portion of the second plate 20, and a second cut surface 81*b* extending vertically from the first cut surface 81*a*.

In addition, the first double-sided adhesive member 81, the fourth double-sided adhesive members 84*a* and 84*d*, and the second and third double-sided adhesive members 82 and 83 are bonded to the back surface of the second plate 20 under the condition that a predetermined gap is provided between each of the first double-sided adhesive member 81 and the fourth double-sided adhesive members 84*a* and 84*d* and a corresponding one of the second and third double-sided adhesive members 82 and 83, such that one end of the second or third double-sided adhesive member 82 or 83 faces the first cut surface 81*a* of a corresponding one of the first double-sided adhesive member 81 and the fourth double-sided adhesive members 84*a* and 84*d*, and a side surface of the second or third double-sided adhesive member 82 or 83 faces the second cut surface 81*b* of a corresponding one of the first double-sided adhesive member 81 and the fourth double-sided adhesive members 84*a* and 84*d*.

The display panel 100 may include, for example, a liquid crystal display panel, an organic light emitting display panel, or an inorganic light emitting display panel. When the display panel 100 is an organic light emitting display panel, the display panel 100 may be weaker against foreign matter or moisture.

Although foreign matter or moisture penetrates a gap corresponding to the first cut surface 81*a* of the first double-sided adhesive member 81 or the fourth double-sided adhesive member 84*a* or 84*d*, penetration of the foreign matter or moisture may be blocked by the second cut surface 81*b* of the first double-sided adhesive member 81 or the fourth double-sided adhesive member 84*a* or 84*d*.

Figure 5:
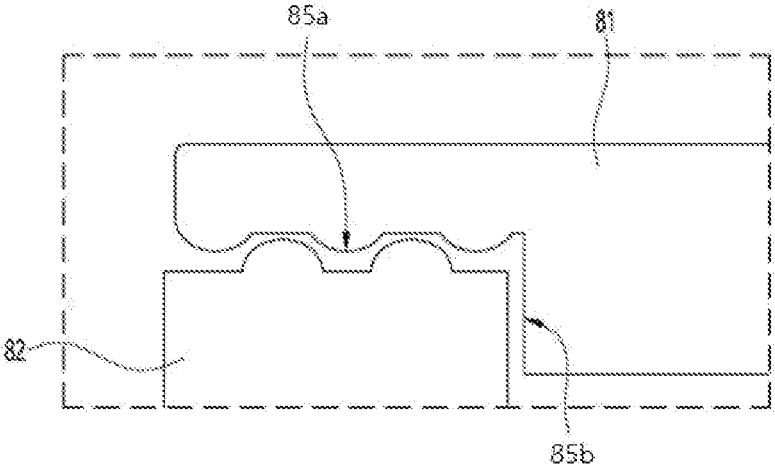
FIG. 5 is an enlarged view of the portion "A" in FIG. 3 according to another embodiment of the present disclosure.

FIG. 5 is an enlarged view of the portion "A" in FIG. 3 according to another embodiment of the present disclosure.

As described with reference to FIG. 4, the first double-sided adhesive member 81 and the fourth double-sided adhesive members 84*a* and 84*d* adjacent to the second and third double-sided adhesive members 82 and 83 are cut to have a "¬" shape. In addition, as shown in FIG. 5, a first cut surface 85*a* of the first double-sided adhesive member 81 or each of the fourth double-sided adhesive members 84*a* and 84*d* may include a protrusion/groove portion. A second cut surface 85*b* of the first double-sided adhesive member 81 or each of the fourth double-sided adhesive members 84*a* and 84*d* does not include a protrusion/groove portion. Of course, the second cut surface 85*b* of the first double-sided adhesive member 81 or each of the fourth double-sided adhesive members 84*a* and 84*d* may include a protrusion/groove portion.

The first double-sided adhesive member 81, the fourth double-sided adhesive members 84*a* and 84*d*, and the second and third double-sided adhesive members 82 and 83 are bonded to the back surface of the second plate 20 under the condition that a predetermined gap is provided between each of the first double-sided adhesive member 81 and the fourth double-sided adhesive members 84*a* and 84*d* and a corresponding one of the second and third double-sided adhesive members 82 and 83, such that one end (or one side) of the second or third double-sided adhesive member 82 or 83 faces the first cut surface 85*a* of a corresponding one of the first double-sided adhesive member 81 and the fourth double-sided adhesive members 84*a* and 84*d*, and a side surface (or the other side) of the second or third double-sided adhesive member 82 or 83 faces the second cut surface 85*b* of a corresponding one of the first double-sided adhesive member 81 and the fourth double-sided adhesive members 84*a* and 84*d*.

As shown in FIG. 5, the one end of the second or third double-sided adhesive member 82 or 83 facing the first cut surface 85*a* of the corresponding one of the first double-sided adhesive member 81 and the fourth double-sided adhesive members 84*a* and 84*d* may also include a protrusion/groove portion.

Each of the protrusion/groove portions of the first cut surface 85*a* of the first double-sided adhesive member 81 or each of the fourth double-sided adhesive members 84*a* and 84*d* and the second or third double-sided adhesive member 82 or 83 may have a rounded structure. Each protrusion/groove portion may have one of a triangular structure, a quadrangular structure, and a polygonal structure. The protrusion/groove portion of the double-sided adhesive member 80 according to the embodiment of the present disclosure may have various shapes, without being limited to the above-described shapes.

Accordingly, the length of the gap corresponding to the first cut surface 85*a* of the first double-sided adhesive member 81 or each of the fourth double-sided adhesive members 84*a* and 84*d* may be increased and, as such, penetration of foreign matter or moisture may be delayed, as compared to the embodiment of FIG. 4. Accordingly, penetration of foreign matter or moisture may be more effectively prevented. Furthermore, penetration of foreign matter or moisture may be blocked by the second cut surface 85*b* of the first double-sided adhesive member 81 or the fourth double-sided adhesive member 84*a* or 84*d*.

Figure 6:
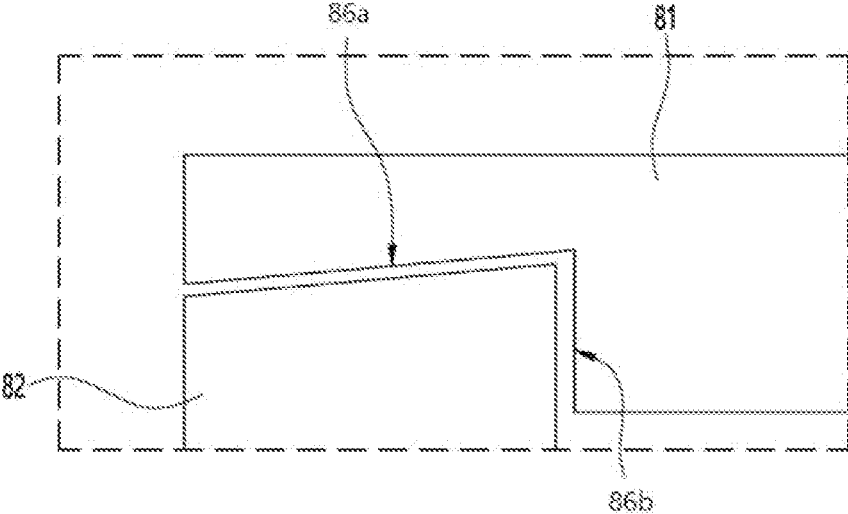
FIG. 6 is an enlarged view of the portion "A" in FIG. 3 according to another embodiment of the present disclosure.

FIG. 6 is an enlarged view of the portion "A" in FIG. 3 according to another embodiment of the present disclosure.

As described with reference to FIG. 4, the first double-sided adhesive member 81 and the fourth double-sided adhesive members 84*a* and 84*d* adjacent to the second and third double-sided adhesive members 82 and 83 are cut to have a "¬" shape. In addition, as shown in FIG. 6, a first cut surface 86*a* of the first double-sided adhesive member 81 or each of the fourth double-sided adhesive members 84*a* and 84*d* may have an inclined surface. An end of the second double-sided adhesive member 82 or the third double-sided adhesive member 83 facing the first cut surface 86*a* may have an inclined surface.

Since the first cut surface 86*a* of the first double-sided adhesive member 81 or each of the fourth double-sided adhesive members 84*a* and 84*d* is formed to have an inclined surface, as described above, penetration of foreign matter or moisture may be delayed, as compared to the embodiment of FIG. 4. Accordingly, penetration of foreign matter or moisture may be more effectively prevented. Furthermore, penetration of foreign matter or moisture may be blocked by a second cut surface 86*b* of the first double-sided adhesive member 81 or the fourth double-sided adhesive member 84*a* or 84*d*.

Figure 7:
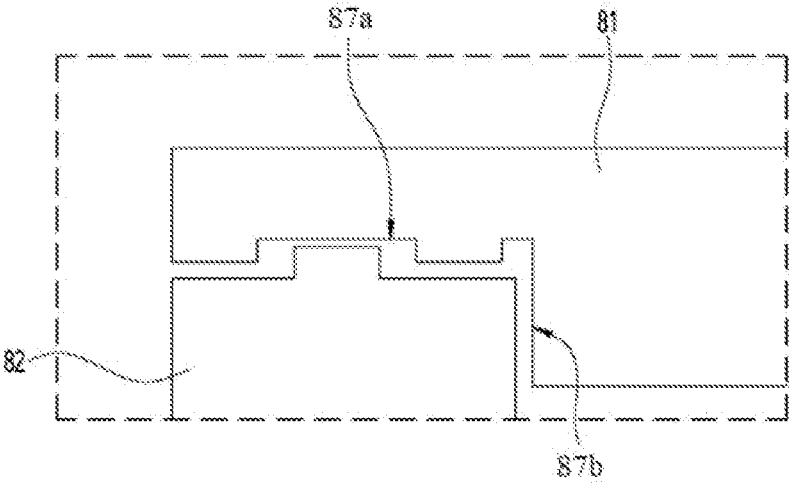
FIG. 7 is an enlarged view of the portion "A" in FIG. 3 according to another embodiment of the present disclosure.

FIG. 7 is an enlarged view of the portion "A" in FIG. 3 according to another embodiment of the present disclosure.

As described with reference to FIG. 4, the first double-sided adhesive member 81 and the fourth double-sided adhesive members 84*a* and 84*d* adjacent to the second and third double-sided adhesive members 82 and 83 are cut to have a "¬" shape.

In addition, as shown in FIG. 7, a first cut surface 87*a* of the first double-sided adhesive member 81 or each of the fourth double-sided adhesive members 84*a* and 84*d* includes a protrusion/groove portion, and a second cut surface 87*b* of the first double-sided adhesive member 81 or each of the fourth double-sided adhesive members 84*a* and 84*d* does not include a protrusion/groove portion. Of course, the second cut surface 87*b* of the first double-sided adhesive member 81 or each of the fourth double-sided adhesive members 84*a* and 84*d* may include a protrusion/groove portion.

The first double-sided adhesive member 81, the fourth double-sided adhesive members 84*a* and 84*d*, and the second and third double-sided adhesive members 82 and 83 are bonded to the back surface of the second plate 20 under the condition that a predetermined gap is provided between each of the first double-sided adhesive member 81 and the fourth double-sided adhesive members 84*a* and 84*d* and a corresponding one of the second and third double-sided adhesive members 82 and 83, such that one end (or one side) of the second or third double-sided adhesive member 82 or 83 faces the first cut surface 87*a* of a corresponding one of the first double-sided adhesive member 81 and the fourth double-sided adhesive members 84*a* and 84*d*, and a side surface of the second or third double-sided adhesive member 82 or 83 faces the second cut surface 87*b* of a corresponding one of the first double-sided adhesive member 81 and the fourth double-sided adhesive members 84*a* and 84*d*.

As shown in FIG. 7, the one end (or the one side) of the second or third double-sided adhesive member 82 or 83 facing the first cut surface 87*a* of the corresponding one of the first double-sided adhesive member 81 and the fourth double-sided adhesive members 84*a* and 84*d* may also include a protrusion/groove portion.

Each of the protrusion/groove portions of the first cut surface 87*a* of the first double-sided adhesive member 81 or each of the fourth double-sided adhesive members 84*a* and 84*d* and the second or third double-sided adhesive member 82 or 83 may have a quadrangular structure.

Accordingly, the length of the gap corresponding to the first cut surface 87*a* of the first double-sided adhesive member 81 or each of the fourth double-sided adhesive members 84*a* and 84*d* may be increased and, as such, penetration of foreign matter or moisture may be delayed, as compared to the embodiment of FIG. 4. Accordingly, penetration of foreign matter or moisture may be more effectively prevented. Furthermore, penetration of foreign matter or moisture may be blocked by the second cut surface 87*b* of the first double-sided adhesive member 81 or the fourth double-sided adhesive member 84*a* or 84*d*.

Figure 8:
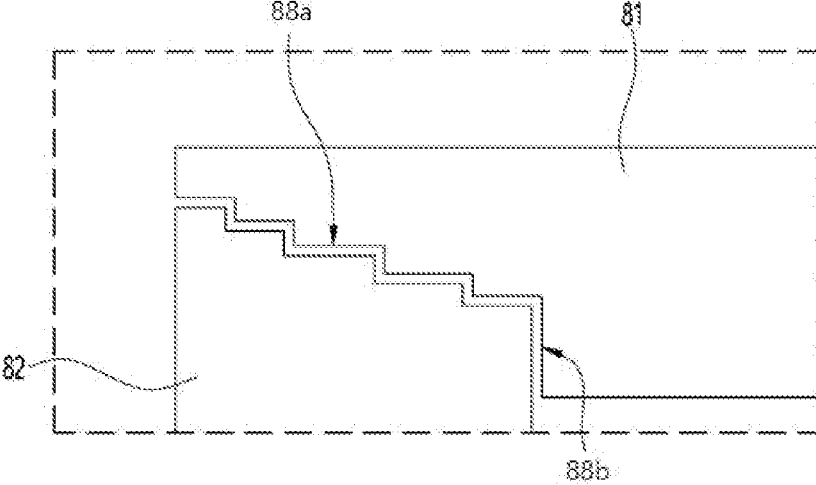
FIG. 8 is an enlarged view of the portion "A" in FIG. 3 according to another embodiment of the present disclosure.

FIG. 8 is an enlarged view of the portion "A" in FIG. 3 according to another embodiment of the present disclosure.

As described with reference to FIG. 4, the first double-sided adhesive member 81 and the fourth double-sided adhesive members 84*a* and 84*d* adjacent to the second and third double-sided adhesive members 82 and 83 are cut to have a "¬" shape. In addition, as shown in FIG. 8, a first cut surface 88*a* of the first double-sided adhesive member 81 or each of the fourth double-sided adhesive members 84*a* and 84*d* has a staircase shape, and a second cut surface 88*b* of the first double-sided adhesive member 81 or each of the fourth double-sided adhesive members 84*a* and 84*d* does not have a staircase shape. Of course, the second cut surface 88*b* of the first double-sided adhesive member 81 or each of the fourth double-sided adhesive members 84*a* and 84*d* may have a staircase shape.

The first double-sided adhesive member 81, the fourth double-sided adhesive members 84*a* and 84*d*, and the second and third double-sided adhesive members 82 and 83 are bonded to the back surface of the second plate 20 under the condition that a predetermined gap is provided between each of the first double-sided adhesive member 81 and the fourth double-sided adhesive members 84*a* and 84*d* and a corresponding one of the second and third double-sided adhesive members 82 and 83, such that one end (or one side) of the second or third double-sided adhesive member 82 or 83 faces the first cut surface 88*a* of a corresponding one of the first double-sided adhesive member 81 and the fourth double-sided adhesive members 84*a* and 84*d*, and a side surface of the second or third double-sided adhesive member 82 or 83 faces the second cut surface 88*b* of a corresponding one of the first double-sided adhesive member 81 and the fourth double-sided adhesive members 84*a* and 84*d*.

As shown in FIG. 8, the one end (or the one side) of the second or third double-sided adhesive member 82 or 83 facing the first cut surface 88*a* of the corresponding one of the first double-sided adhesive member 81 and the fourth double-sided adhesive members 84*a* and 84*d* may also have a staircase shape.

Accordingly, the length of the gap corresponding to the first cut surface 88*a* of the first double-sided adhesive member 81 or each of the fourth double-sided adhesive members 84*a* and 84*d* may be increased and, as such, penetration of foreign matter or moisture may be delayed, as compared to the embodiment of FIG. 4. Accordingly, penetration of foreign matter or moisture may be more effectively prevented. Furthermore, penetration of foreign matter or moisture may be blocked by the second cut surface 88*b* of the first double-sided adhesive member 81 or the fourth double-sided adhesive member 84*a* or 84*d*.

In the display apparatus shown in FIG. 3, the fourth double-sided adhesive members 84*a* and 84*d* respectively disposed adjacent to the second and third double-sided adhesive members 82 and 83 are also cut to have a "¬" shape. Accordingly, each of the fourth double-sided adhesive members 84*a* and 84*d* has a first cut surface 81*a* extending inwards from an edge portion of the second plate 20, and a second cut surface 81*b* extending vertically from the first cut surface 81*a*.

The first cut surface 81*a* of each of the fourth double-sided adhesive members 84*a* and 84*d* according to the embodiment of the present disclosure shown in FIG. 3 may have the structure described with reference to each of FIGS. 4 to 8.

Figure 9A:
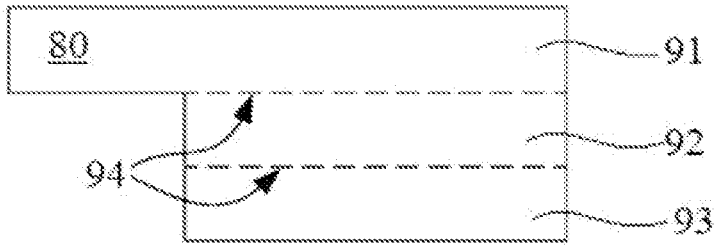
FIGS. 9A to 9C are views explaining a method of bonding a double-sided adhesive member in accordance with an embodiment of the present disclosure.
Figure 9B:
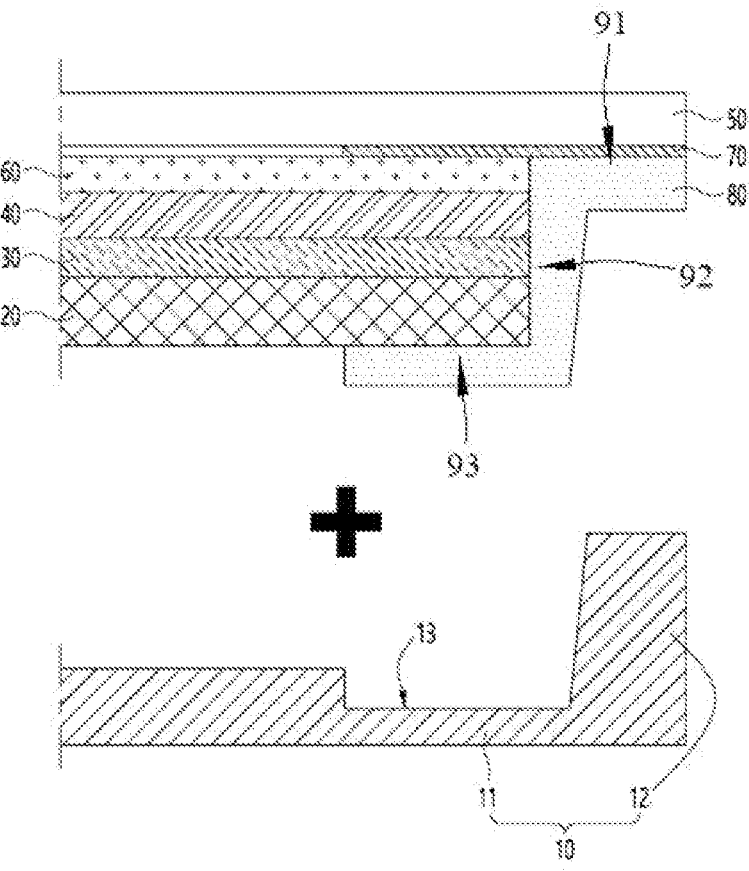
Figure 9C:
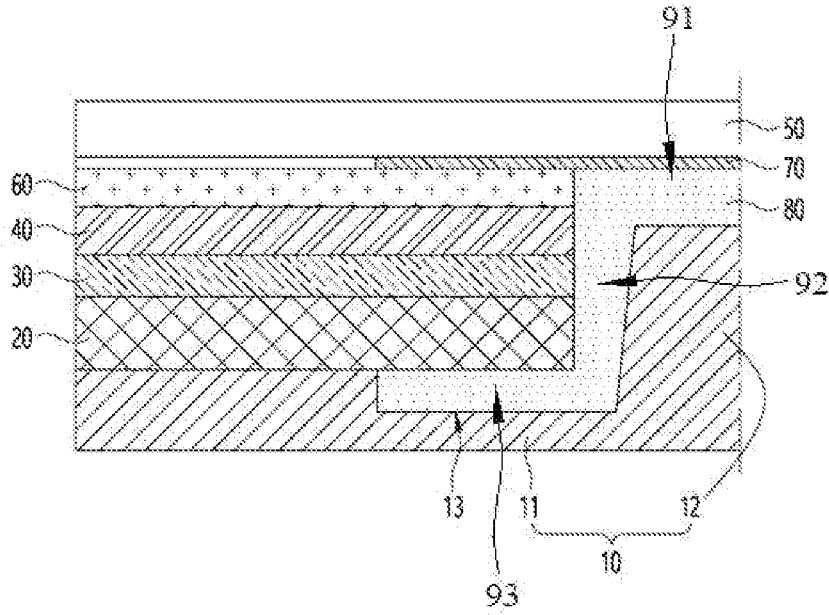

FIGS. 9A to 9C are views explaining a method of bonding the double-sided adhesive member in accordance with an embodiment of the present disclosure.

As described above, one adhesive surface of the double-sided adhesive member 80 is bonded to the bezel region of the cover member 50 (a first region 91) coated with the black layer 70, the side surfaces of the display panel 30 and the optical film 40, and the second plate 20 (a second region 92), and the back surface of the second plate 20 (a third region 93), whereas the other adhesive surface of the double-sided adhesive member 80 is bonded to the surface of the barrier wall 12 of the first plate 10 (the first region 91), the inner surface of the barrier wall 12 (the second region 92), and a portion of the bottom surface 11 of the first plate 10 (the third region 93).

When the double-sided adhesive member 80 is bonded to the first to third regions 91, 92, and 93, a boundary portion of each region should be easily bent in order to achieve an enhancement in bonding force in each region.

To this end, as shown in FIG. 9A, the double-sided adhesive member 80 may be divided into the first region 91 corresponding to the bezel region of the cover member 50, the second region 92 corresponding to the side surfaces of the display panel 30, the optical film 40, and the second plate 20, and the third region 93 corresponding to the back surface of the second plate 20, and a bending guide line 94 may be formed at each boundary portion of the first to third regions 91, 92, and 93.

As shown in FIG. 9B, one adhesive surface of the double-sided adhesive member 80 formed with the bending guide line 94 is attached to the bezel region of the cover member 50, the side surfaces of the display panel 30, the optical film 40, and the second plate 20, and the back surface of the second plate 20. For example, the first region 91 of the double-sided adhesive member 80 is attached to the bezel region of the cover member 50, the second region 92 of the double-sided adhesive member 80 is attached to the side surfaces of the display panel 30, the optical film 40, and the second plate 20, and the third region 93 of the double-sided adhesive member 80 is bonded to the back surface of the second plate 20.

As shown in FIG. 9C, the first plate 10 is bonded to the other adhesive surface of the double-sided adhesive member 80.

Conversely, the double-sided adhesive member 80 may be attached to the first plate 10, and may then be attached to the bezel area of the cover member 50, the side surfaces of the display panel 30, the optical film 40, and the second plate 20, and the back surface of the second plate 20.

A display apparatus according to an embodiment of the present disclosure may be constituted through inclusion of a first plate, a second plate, a display panel, and a cover member sequentially stacked on the first plate, and a double-sided adhesive member configured to bond the second plate and the cover member to the first plate at edge portions of four sides of the display apparatus.

The display apparatus may further include an optical film between the display panel and the cover member.

The cover member and the optical film may be bonded to each other by an optically clear adhesive.

The first plate may include a bottom surface, and a barrier wall extending upwards from an edge portion of the bottom surface. The second plate, the display panel, and the optical film may be seated on the bottom surface of the first plate inside the barrier wall.

One adhesive surface of the double-sided adhesive member may be bonded to a bezel region of the cover member, side surfaces of the display panel and the optical film, and a back surface of the second plate, whereas the other adhesive surface of the double-sided adhesive member may be bonded to a surface (e.g., an upper surface) of the barrier wall, an inner surface of the barrier wall, and a portion of the bottom surface of the first plate.

A groove may be formed at the bottom surface of the first plate to which the double-sided adhesive member is bonded.

A black layer may be coated on a back surface of the cover member in the bezel region.

The double-sided adhesive member may include a first double-sided adhesive member bonded to a first edge of the display apparatus, second and third double-sided adhesive members respectively bonded to opposite edge portions of the first edge, and a fourth double-sided adhesive member bonded to an edge of the display apparatus opposite to the first edge. The first to fourth double-sided adhesive members may be bonded while being spaced apart from one another by a predetermined distance without overlapping one another.

The first double-sided adhesive member adjacent to the second and third double-sided adhesive members may be cut to have a "¬" shape, thereby having a first cut surface extending inwards from an edge portion of the first double-sided adhesive member, and a second cut surface extending vertically from the first cut surface.

The fourth double-sided adhesive member adjacent to the second and third double-sided adhesive members may be cut to have a "¬" shape, thereby having a first cut surface extending inwards from an edge portion of the fourth double-sided adhesive member, and a second cut surface extending vertically from the first cut surface.

Each of the first cut surface of the first double-sided adhesive member or the fourth double-sided adhesive member and an end of the second or third double-sided adhesive member corresponding to the first cut surface may have a protrusion/groove portion.

The protrusion/groove portion may have a rounded structure, a triangular structure, a polygonal structure, or a quadrangular structure.

Each of the first cut surface of the first double-sided adhesive member or the fourth double-sided adhesive member and an end of the second or third double-sided adhesive member corresponding to the first cut surface may have an inclined surface.

Each of the first cut surface of the first double-sided adhesive member or the fourth double-sided adhesive member and an end of the second or third double-sided adhesive member corresponding to the first cut surface may have a staircase shape.

A source PCB, which is mounted on one or more source drive IC flexible circuit films, to be connected to the display panel, may be disposed between the second plate and the first plate.

As apparent from the above-description, the display apparatus according to the embodiment of the present disclosure having the above-described features has the following effects.

Since an attachment area of the display apparatus attached to the first plate at four sides of the display apparatus is increased, it may be possible to prevent foreign matter or moisture from penetrating into the display apparatus. Accordingly, a display apparatus having low power consumption and long lifespan may be provided.

Adjacent ones of the double-sided adhesive members respectively bonded to the four sides of the display apparatus are cut to have a "¬" shape such that each of the adjacent double-sided adhesive members has a first cut surface, and a second cut surface extending vertically from the first cut surface, and one end of the double-sided adhesive member bonded to one side of the display apparatus faces the first cut surface of the double-sided adhesive member bonded to another side of the display apparatus. Accordingly, even when foreign matter or moisture penetrates, penetration of the foreign matter or moisture may be blocked by the second cut surface of the double-sided adhesive member.

Since the first cut surface of one double-sided adhesive member and the end of the other double-sided adhesive member facing the first cut surface have a protrusion/groove portion, an inclined surface, or a staircase shape, penetration of foreign matter or moisture may be further blocked.

Effects of the present disclosure are not limited to the above-described effects. Other effects not described in the present disclosure may be readily understood by those skilled in the art from the appended claims.

Although the foregoing description has been given mainly in conjunction with embodiments, these embodiments are only illustrative without limiting the disclosure. Those skilled in the art to which the present disclosure pertains can appreciate that various modifications and applications illustrated in the foregoing description may be possible without changing essential characteristics of the embodiments. Therefore, the above-described embodiments should be understood as exemplary rather than limiting in all aspects. In addition, the scope of the present disclosure should also be interpreted by the claims below rather than the above detailed description. All modifications or alterations as would be derived from the equivalent concept intended to be included within the scope of the present disclosure should also be interpreted as falling within the scope of the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display apparatus comprising:
a first plate;
a second plate disposed on the first plate;
a display panel disposed on the second plate;
a cover member disposed on the display panel; and
a double-sided adhesive member includes a plurality of double-sided adhesive members respectively bonded to the first plate at edge portions of four sides of the display apparatus to bond the second plate and the cover member to the first plate, the plurality of double-sided adhesive members being spaced apart from one another without overlapping one another in a plan view.

2. The display apparatus according to claim 1, wherein the first plate comprises a bottom surface, and a barrier wall extending upwards from an edge portion of the bottom surface, and the second plate and the display panel are disposed on the bottom surface of the first plate inside the barrier wall.

3. The display apparatus according to claim 1, further comprising:
an optical film between the display panel and the cover member.

4. The display apparatus according to claim 3, further comprising an optically clear adhesive between the cover member and the optical film, the optically clear adhesive bonding the cover member and the optical film to each other.

5. The display apparatus according to claim 3, wherein the first plate comprises a bottom surface, and a barrier wall extending upwards from an edge portion of the bottom surface, and the second plate, the display panel, and the optical film are disposed on the bottom surface of the first plate inside the barrier wall.

6. The display apparatus according to claim 5, wherein:
one adhesive surface of the double-sided adhesive member is bonded to a bezel region of the cover member, side surfaces of the display panel and the optical film, and a side surface and a back surface of the second plate; and
another adhesive surface of the double-sided adhesive member is bonded to an upper surface of the barrier wall, an inner surface of the barrier wall, and a portion of the bottom surface of the first plate.

7. The display apparatus according to claim 6, wherein the bottom surface of the first plate, to which the double-sided adhesive member is bonded, comprises a groove.

8. The display apparatus according to claim 6, further comprising:
a black layer at a back surface of the cover member in the bezel region.

9. The display apparatus according to claim 1, wherein:
the plurality of double-sided adhesive members comprises:
a first double-sided adhesive member bonded to a first edge portion of the display apparatus;
second and third double-sided adhesive members respectively bonded to two edge portions adjacent to the first edge portion; and
a fourth double-sided adhesive member bonded to an edge portion of the display apparatus opposite to the first edge portion; and

wherein the first to fourth double-sided adhesive members are spaced apart from one another without overlapping one another.

10. The display apparatus according to claim 9, wherein the first double-sided adhesive member adjacent to the second and third double-sided adhesive members is cut to have a "¬" shape, thereby having a first cut surface extending inwards from an edge portion of the first double-sided adhesive member, and a second cut surface extending vertically from the first cut surface.

11. The display apparatus according to claim 9, wherein the fourth double-sided adhesive member adjacent to the second and third double-sided adhesive members is cut to have a "¬" shape, thereby having a first cut surface extending inwards from an edge portion of the fourth double-sided adhesive member, and a second cut surface extending vertically from the first cut surface.

12. The display apparatus according to claim 10, wherein each of the first cut surface of the first double-sided adhesive member or the fourth double-sided adhesive member and an end of the second or third double-sided adhesive member corresponding to the first cut surface comprises a protrusion/groove portion.

13. The display apparatus according to claim 12, wherein the protrusion/groove portion comprises a rounded structure, a triangular structure, a polygonal structure, or a quadrangular structure.

14. The display apparatus according to claim 10, wherein each of the first cut surface of the first double-sided adhesive member or the fourth double-sided adhesive member and an end of the second or third double-sided adhesive member corresponding to the first cut surface has an inclined surface.

15. The display apparatus according to claim 11, wherein each of the first cut surface of the first double-sided adhesive member or the fourth double-sided adhesive member and an end of the second or third double-sided adhesive member corresponding to the first cut surface has an inclined surface.

16. The display apparatus according to claim 10, wherein each of the first cut surface of the first double-sided adhesive member or the fourth double-sided adhesive member and an end of the second or third double-sided adhesive member corresponding to the first cut surface has a staircase structure.

17. The display apparatus according to claim 11, wherein each of the first cut surface of the first double-sided adhesive member or the fourth double-sided adhesive member and an end of the second or third double-sided adhesive member corresponding to the first cut surface has a staircase structure.

18. The display apparatus according to claim 1, wherein a source PCB is disposed between the second plate and the first plate, and the source PCB is mounted on one or more source drive integrated circuit flexible circuit films, to be connected to the display panel.

19. The display apparatus according to claim 1, wherein the second plate comprises aluminum.

20. The display apparatus according to claim 1, wherein the display panel comprises an organic light emitting display panel.

21. The display apparatus according to claim 1, wherein the second plate is disposed on the first plate and underlies the display panel across a planar area of the display panel.

* * * * *